(12) United States Patent
Kim et al.

(10) Patent No.: US 10,141,284 B2
(45) Date of Patent: Nov. 27, 2018

(54) METHOD OF BONDING SEMICONDUCTOR SUBSTRATES

(71) Applicant: IMEC VZW, Leuven (BE)

(72) Inventors: Soon-Wook Kim, Heverlee (BE); Lan Peng, Leuven (BE); Patrick Verdonck, Sterrebeek (BE); Robert Miller, Lubbeek (BE); Gerald Peter Beyer, Heverlee (BE); Eric Beyne, Heverlee (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/604,454

(22) Filed: May 24, 2017

(65) Prior Publication Data

US 2017/0301646 A1    Oct. 19, 2017

Related U.S. Application Data

(63) Continuation of application No. PCT/EP2015/077424, filed on Nov. 24, 2015.

(30) Foreign Application Priority Data

Nov. 24, 2014 (EP) .................................. 14194506

(51) Int. Cl.
*H01L 23/00* (2006.01)
*H01L 23/31* (2006.01)
(Continued)

(52) U.S. Cl.
CPC .......... *H01L 24/83* (2013.01); *H01L 23/3192* (2013.01); *H01L 24/03* (2013.01);
(Continued)

(58) Field of Classification Search
CPC ................................ H01L 24/83; H01L 24/32
See application file for complete search history.

(56) References Cited

U.S. PATENT DOCUMENTS 8,993,460 B2 *  3/2015  LaVoie .............. C23C 16/45529
                                                        438/786
9,027,821 B2 *  5/2015  Di Cioccio ......... H01L 21/2007
                                                        228/120
(Continued)

FOREIGN PATENT DOCUMENTS

FR      2 978 606 A1      2/2013
WO   WO 2016/083332 A1   6/2016

OTHER PUBLICATIONS

International Search Report and Written Opinion dated Mar. 3, 2016 in International Application No. PCT/EP2015/077424, 13 pages.

*Primary Examiner* — William Coleman
(74) *Attorney, Agent, or Firm* — Knobbe, Martens, Olson & Bear LLP

(57) ABSTRACT

The disclosed technology generally relates to semiconductor wafer bonding, and more particularly to direct bonding by contacting surfaces of the semiconductor wafers. In one aspect, a method for bonding a first semiconductor substrate to a second semiconductor substrate by direct bonding is described. The substrates are both provided on their contact surfaces with a dielectric layer, followed by a CMP step for reducing the roughness of the dielectric layer. Then a layer of SiCN is deposited onto the dielectric layer, followed by a CMP step which reduces the roughness of the SiCN layer to the order of 1 tenth of a nanometer. Then the substrates are subjected to a pre-bond annealing step and then bonded by direct bonding, possibly preceded by one or more pre-treatments of the contact surfaces, and followed by a post-bond annealing step, at a temperature of less than or equal to 250° C. It has been found that the bond strength is excellent, even at the above named annealing temperatures, which are lower than presently known in the art.

18 Claims, 7 Drawing Sheets

(51) Int. Cl.
*H01L 25/065* (2006.01)
*H01L 21/02* (2006.01)
*H01L 21/3105* (2006.01)

(52) U.S. Cl.
CPC .............. *H01L 24/05* (2013.01); *H01L 24/08* (2013.01); *H01L 24/32* (2013.01); *H01L 24/80* (2013.01); *H01L 25/0657* (2013.01); *H01L 21/02065* (2013.01); *H01L 21/02164* (2013.01); *H01L 21/02167* (2013.01); *H01L 21/02211* (2013.01); *H01L 21/02274* (2013.01); *H01L 21/31053* (2013.01); *H01L 2224/03452* (2013.01); *H01L 2224/03462* (2013.01); *H01L 2224/03616* (2013.01); *H01L 2224/03845* (2013.01); *H01L 2224/03848* (2013.01); *H01L 2224/05568* (2013.01); *H01L 2224/05573* (2013.01); *H01L 2224/05576* (2013.01); *H01L 2224/05686* (2013.01); *H01L 2224/08121* (2013.01); *H01L 2224/08145* (2013.01); *H01L 2224/32501* (2013.01); *H01L 2224/80097* (2013.01); *H01L 2224/80201* (2013.01); *H01L 2224/80357* (2013.01); *H01L 2224/80895* (2013.01); *H01L 2224/80896* (2013.01); *H01L 2224/80948* (2013.01); *H01L 2224/83031* (2013.01); *H01L 2224/83047* (2013.01); *H01L 2224/83048* (2013.01); *H01L 2224/83359* (2013.01)

(56) References Cited

U.S. PATENT DOCUMENTS

| | | | |
|---|---|---|---|
| 9,284,472 B2* | 3/2016 | Saeki | H01L 21/31053 |
| 9,472,472 B2* | 10/2016 | Matsugai | H01L 22/12 |
| 2008/0061419 A1 | 3/2008 | Enquist et al. | |
| 2010/0211849 A1 | 8/2010 | Djordjevic et al. | |
| 2012/0043647 A1 | 2/2012 | Gaudin | |
| 2012/0211849 A1 | 8/2012 | Matsugai | |
| 2013/0009321 A1 | 1/2013 | Kagawa et al. | |
| 2013/0207268 A1 | 8/2013 | Chapelon | |
| 2013/0270328 A1 | 10/2013 | Di Cioccio et al. | |

* cited by examiner

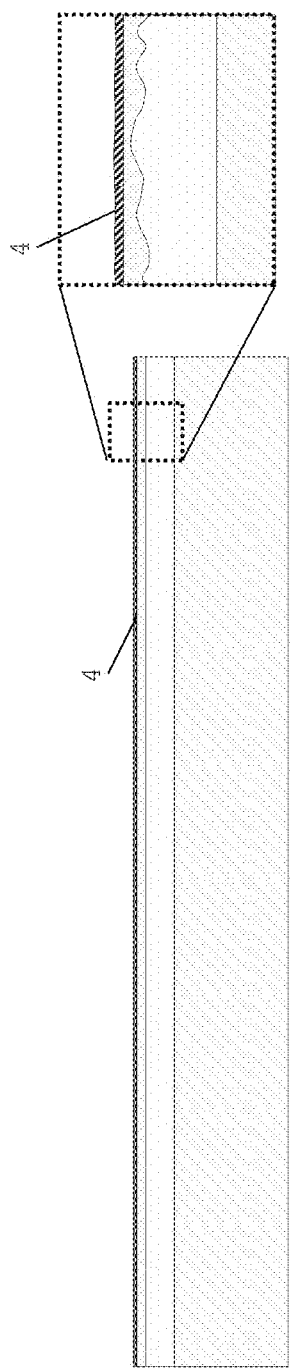
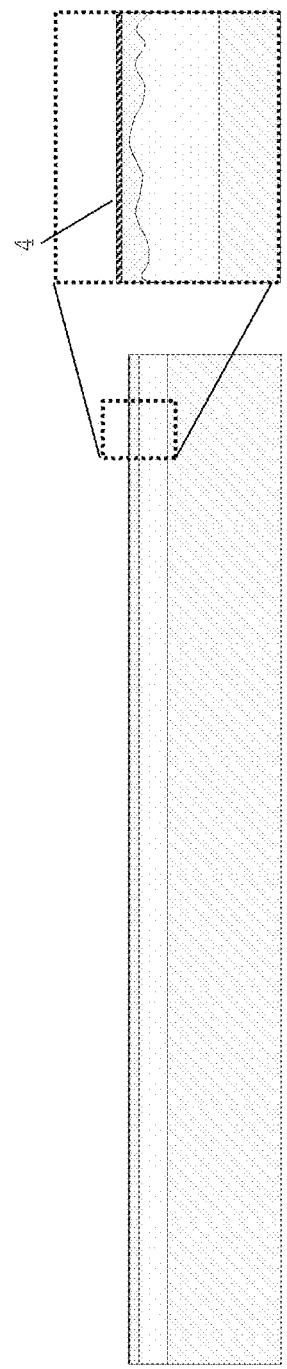

METHOD OF BONDING SEMICONDUCTOR SUBSTRATES

CROSS-REFERENCE TO RELATED APPLICATIONS

This application is a continuation of PCT Application No. PCT/EP2015/077424, filed on Nov. 24, 2015, which claims priority to European Patent Application No. EP 14194506.3, filed on Nov. 24, 2014. Each of the above applications is incorporated herein by reference in its entirety.

BACKGROUND

Technological Field

The disclosed technology generally relates to semiconductor wafer bonding, and more particularly to direct bonding by contacting surfaces of the semiconductor wafers.

Description of the Related Technology

Direct bonding on wafer level, commonly referred to as 'wafer-to-wafer' bonding, involves the alignment and contacting at room temperature of two semiconductor wafers, e.g., silicon wafers, followed by an annealing step, during which step chemical bonds are formed between the materials on at least a portion of the contacted wafer surfaces.

Wafer-to-wafer bonding technologies fall under two main categories. In a first category, surfaces of both wafers are blanket, or flat unpatterned dielectric bonding layers. The bonding layers can be formed of, e.g., silicon oxide, silicon nitride or a low-k dielectric layer (e.g., silicon-carbon-oxide layer). In a second category, sometimes referred to as hybrid wafer bonding, the surfaces of both wafers are flat and patterned dielectric/metal layers. The main area fraction of the surface of each wafers is covered by the dielectric material, while other areas are metallic, mainly forming contact pads and metal lines. Bonding between dielectric areas takes place by the same mechanism as described above with respect to the first category. Locations where metallic areas overlap can be used to realize electrical contacts between the wafers.

For both categories, the challenge is to achieve a very flat, low roughness dielectric bonding layer which is beneficial for obtaining void-free bonds with a high bond strength. In some technologies, chemical mechanical polishing (CMP) is applied to reduce the roughness of the dielectric layers. In some technologies, surface treatments are applied, e.g., plasma surface treatment and ultrasonic or other cleaning techniques. Post-bond annealing is generally performed at temperatures higher than 400° C. in order to reach the desired bond strength. In order to reduce the thermal budget of the bonding process, it is desirable to obtain high strength bonds at lower temperatures. This can be particularly important in the field of memory devices, where the substrates have formed or partially formed thereon memory device structures, which can degrade at high temperatures.

For the second category, an additional problem is the diffusion of the metal into the dielectric bonding layer. This is the case for example when silicon oxide bonding is applied to bonding of hybrid wafers that comprise copper line patterns, resulting in direct Cu contact to the oxide surface of the mating wafer. During annealing, the Cu may diffuse in the oxide, resulting in leakage or shorting between interconnect nets. In order to avoid this diffusion, a dielectric bonding layer can be applied that forms a barrier against the Cu-diffusion, such as silicon nitride. However, this makes achieving a high bonding force more difficult and increases the interconnect capacitance due to the higher dielectric constant of the Si nitride versus the Si oxide.

The same problems are confronted in the 'die to wafer' bonding processes, wherein a silicon chip is bonded to a carrier wafer by direct bonding. In the latter domain, it has been known to apply Silicon Carbon Nitride (SiCN) as the dielectric bonding layer. Reference is made to US2013/0207268. Like silicon nitride, SiCN is a good Cu diffusion barrier. However, the cited document fails to describe the bonding process in detail and no information is given on applicable annealing temperatures. US2010/0211849 describes SiCN as a 'bonding aid film' in a direct wafer-to-wafer bonding process. This process is however open to further improvement in terms of the thermal budget (the post-bonding annealing temperature is 400° C.).

SUMMARY OF CERTAIN INVENTIVE ASPECTS

The disclosed technology is related to a method as disclosed in the appended claims. The disclosed technology is related to a method for bonding a first semiconductor substrate to a second semiconductor substrate by direct bonding, wherein the substrates are both provided on their contact surfaces with a dielectric layer, followed by a CMP step for reducing the roughness of the dielectric layer. Preferably, the dielectric layer after CMP has an roughness of less than 0.2 nm RMS. Then a layer of SiCN is deposited onto the thinned dielectric layer, followed by a CMP step which reduces the roughness of the SiCN layer to the order of 1 tenth of a nanometer. Preferably the RMS value after CMP is less than 0.1 nm RMS. Then the substrates are subjected to a pre-bond annealing step. The substrates are then bonded by direct bonding, possibly preceded by one or more pre-treatments of the contact surfaces, and followed by a post-bond annealing step, at a temperature of less than or equal to 250° C., preferably between 200° C. and 250° C. It has been found that the bond strength is excellent, even at the above named annealing temperatures, which are lower than presently known in the art.

In one aspect, the disclosed technology is thus related to a method for bonding a first semiconductor substrate to a second semiconductor substrate, wherein both substrates are subjected to the following steps, prior to bonding:
  deposition of a dielectric layer on the surface of the substrate,
  subjecting the dielectric layer to a CMP step to reduce the roughness of said dielectric layer,
  deposition of a silicon carbon nitride layer on the surface of the dielectric layer,
  subjecting the substrate to a pre-bond annealing step,
  subjecting the SiCN layer to a CMP step to reduce the roughness of said SiCN layer, wherein the bonding comprises:
    aligning the substrates,
    bringing the SiCN layers of both substrates into physical contact, to form an assembly of bonded substrates,
    and wherein the method further comprises the step of subjecting the assembly to a post-bond annealing step.

According to a preferred embodiment, the annealing temperature of the post-bond annealing step is less than or equal to 250° C., more preferably said temperature is between 200° C. and 250° C.

According to an embodiment, the roughness of the SiCN layer on both substrates, after the step of subjecting the SiCN layers to CMP, is less than or equal to 0.1 nm RMS.

According to an embodiment, the roughness of the dielectric layer on both substrates, after the step of subjecting the dielectric layers to CMP, is less than or equal to 0.2 nm. The dielectric layer deposited on the substrates may be a layer of silicon oxide.

According to one embodiment of the method of the disclosed technology, the substrates are blanket wafers, wherein the dielectric and SiCN layers are continuous layers.

According to another embodiment, the substrates are hybrid dielectric/metal wafers comprising a patterned surface having areas of dielectric material and areas of metal, and the pre-bond annealing step is followed by:
  etching openings in the stack of layers formed by the dielectric layer and the SiCN layer, thereby exposing portions of the metal areas on the substrate,
  depositing metal in said openings and on the surface of the dielectric/SiCN stack,
  wherein the CMP step performed on the SiCN layer is a CMP that starts on the metal layer deposited on the surface of the dielectric/SiCN stack, removing the metal from said surface, and stopping on the SiCN layer, thereby reducing the roughness of said SiCN layer.

According to an embodiment, the temperature during bonding is the same as the post-bond annealing temperature. The pre-bond annealing temperature may be between 400° C. and 450° C.

In another aspect, an assembly of bonded substrates formed according to the above methods comprises first and second substrates each comprising a functional layer comprising semiconductor devices interconnected by back-end-of-the line metallization, a silicon oxide layer formed on the functional layer, and a SiCN formed on the silicon oxide layer. The silicon oxide layer is a planarized layer such that an interface formed between the silicon oxide layer and the SiCN layer has a roughness less than or equal to 0.2 nm root mean square (RMS). The SiCN layers of the first and second layer are bonded to each other to form a bonded interface having a bond strength greater than about 2.0 J/m². The SiCN layers are planarized layers such that the bonded interface has a roughness less than or equal to 0.1 nm root mean square (RMS).

BRIEF DESCRIPTION OF THE DRAWINGS

FIG. 1a to 1f illustrate the process steps for direct bonding of blanket wafers in a wafer-to-wafer bonding process according to the disclosed technology.

DETAILED DESCRIPTION OF CERTAIN ILLUSTRATIVE EMBODIMENTS

In the following description, the materials silicon oxide and silicon carbon nitride are defined as follows. Silicon oxide is defined by the formula $SiO_x$, with x between 1.4 and 2.1. Silicon carbon nitride, hereafter referred to as SiCN, is defined by the formula $SiC_yN_z$ with y between 0.7 and 1.1 and z between 0.1 and 0.4. The term SiCN also includes layers of $SiC_yN_z$:H, wherein the 'H' represents hydrogen atoms attached to the SiCN molecules. This may be obtained as a consequence of the precursors used in the deposition method for the SiCN layers.

FIG. 1 illustrates the process steps of a wafer-to-wafer bonding process according to the disclosed technology, for the direct bonding of two blanket wafers, i.e. wafers covered over their entire surface with a dielectric bonding layer. As illustrated in FIG. 1a, the wafers may be silicon wafers comprising a silicon bulk portion 1 and a functional layer 2 which may comprise semiconductor devices together with a stack of interconnect layers, said functional layer being best known in the art as a FEOL/BEOL layer (Front-end-of-line/Back-end-of-line). The aim is to produce a bond between two such wafers. As seen in the detail of FIG. 1a, a microscopic but significant roughness is exhibited by the FEOL/BEOL layer 2, which may be mainly due to a degree of surface topography of the layer.

Figure 1A:
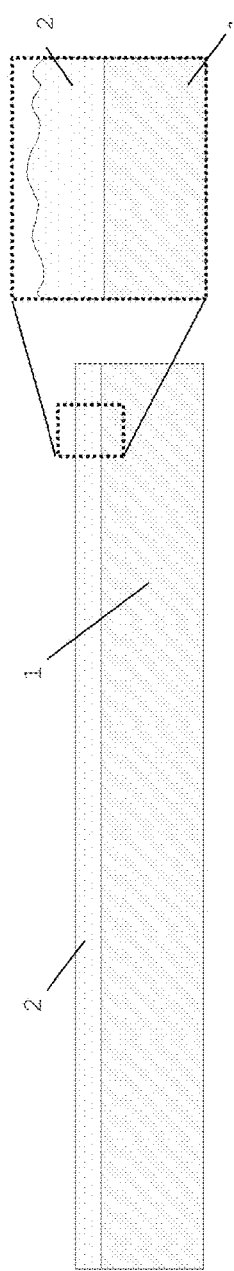
Figure 1B:
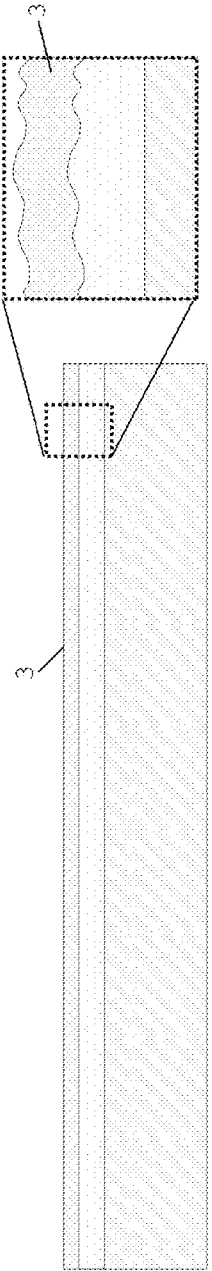
Figure 1C:
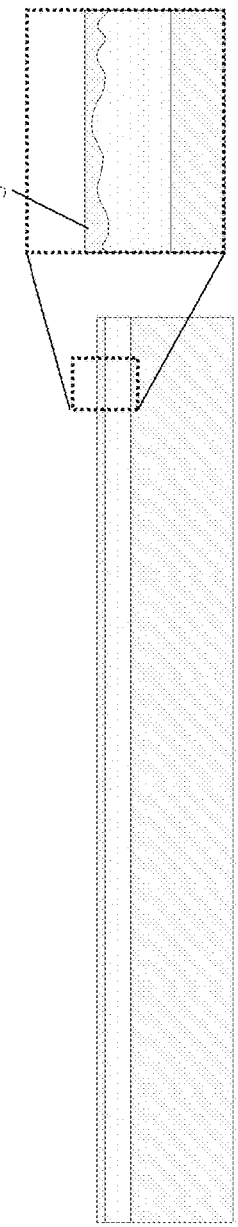
Figure 1F:
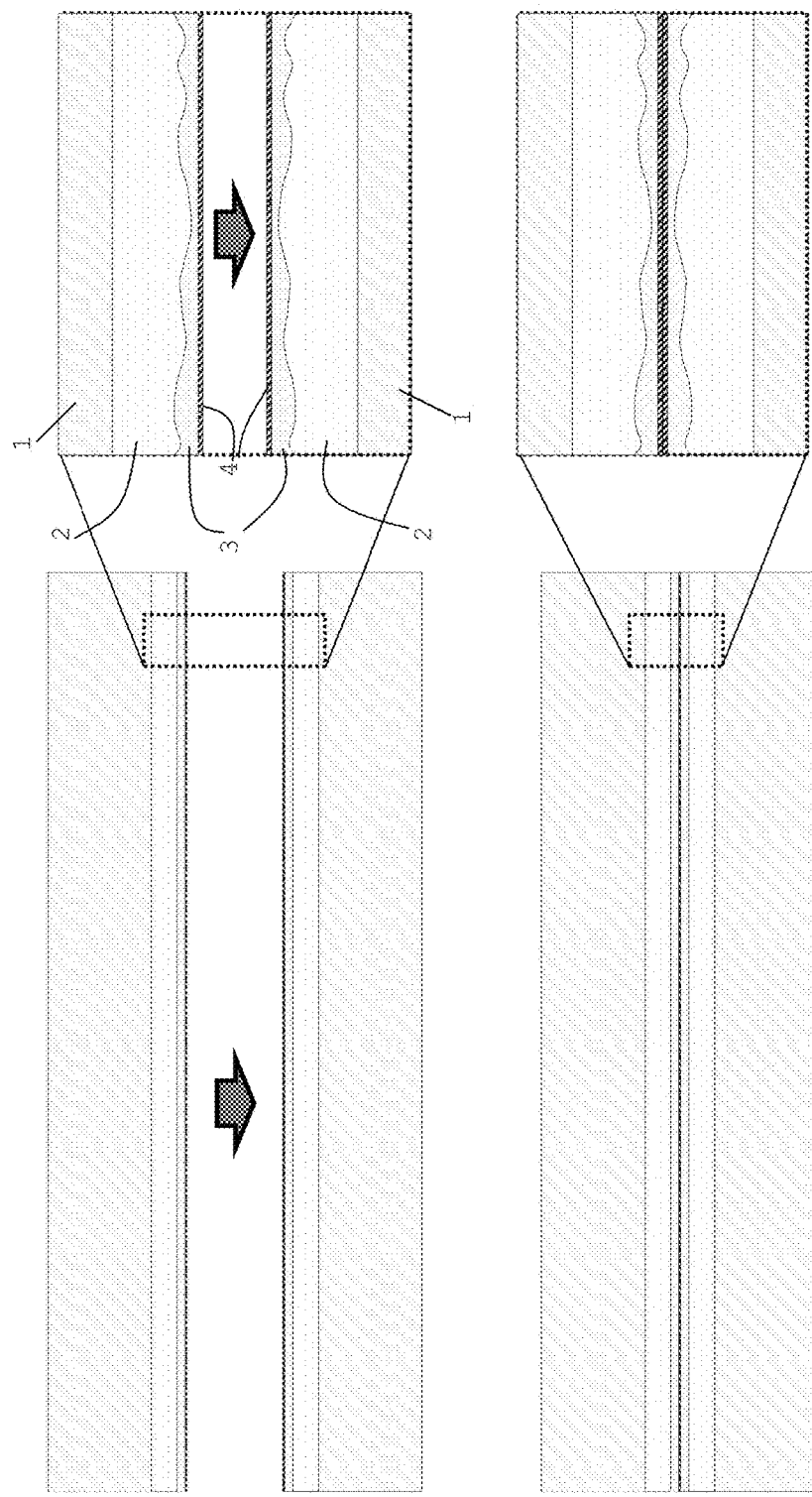

A thick layer 3 of SiO, is then deposited onto the FEOL/BEOL layer 2, see FIG. 1b, covering the totality of said FEOL/BEOL layer 2. As illustrated in the detail of FIG. 1b, the $SiO_x$ layer thickness is high compared to the roughness of the FEOL/BEOL layer, e.g. at least ten times higher that said roughness (expressed as RMS value or expressed as a step height value when the roughness of the FEOL/BEOL layer 2 is mainly defined by the topography). In absolute terms, the $SiO_x$ layer 3 may have a thickness between 100 nm and 6 micron. The $SiO_x$ layer is then thinned by a CMP step, thereby reducing the roughness to a lower value, preferably lower than 0.2 nm RMS (FIG. 1c). Instead of a $SiO_x$ layer, other dielectric layers may be used, e.g. a silicon nitride layer. Preferably, the dielectric layer 3 is an inorganic dielectric layer. An organic dielectric layer 3 is not excluded, but in that case, a curing step of the dielectric layer is required to avoid outgassing of the layer during subsequent process steps.

Then a layer 4 of SiCN is deposited onto the thinned SiO, layer (FIG. 1d). The deposition may take place by Plasma Enhanced Chemical Vapour Deposition (PECVD), resulting in an amorphous SiCN layer 4. The SiCN layer is thin, preferably between 10 nm and 1 micron, more preferably between 50 nm and 150 nm. The wafers are then subjected to an pre-bond annealing step.

A CMP step is then performed on the SiCN layer, reducing the roughness of the layer to the order of tenths of a nanometer, preferably having a roughness of less than 0.1 nm RMS (FIG. 1e). The steps illustrated in FIGS. 1a to 1d may be performed as part of a BEOL integration scheme. In that case, the pre-bond anneal temperature is preferably compatible with such an integration scheme, and may be between 400° C. and 450° C., preferably around 420° C.

The wafers which have both been prepared in the above-described way, are then aligned and bonded (FIG. 1f) to form an assembly of the two bonded substrates. Any standard alignment technique known in the art can be used, for example based on a camera image of the wafers to be aligned or based on interferometry. Possibly a number of pre-treatments are performed on the contact surfaces, such as a plasma treatment and/or a cleaning step (e.g. megasonic cleaning). The bonding takes place in a bonding tool as known per se in the art, wherein possibly some of the pre-treatments may be performed as well.

The bond is produced by bringing the two polished SiCN surfaces in contact with each other under appropriate process conditions (see further). The extremely low surface roughness facilitates the formation of chemical bonds between the contact surfaces, thereby improving the bond strength between the wafers.

The bond strength is further improved by a post-bond annealing step performed while the wafers are in contact, at a temperature of less than or equal to 250° C., preferably between 200° C. and 250° C. Despite the low anneal temperature, the bond strength between the wafers is excellent.

FIG. 2 illustrates the method of the disclosed technology in the case of the direct bonding of hybrid dielectric/metal wafers. Each of the wafers that are to be bonded comprises metal islands 10 on the surface of the FEOL/BEOL layer 2. These islands can represent contact pads or metal lines. The surface of the FEOL/BEOL layer 2 again shows a degree of roughness, as illustrated in the detail of FIG. 2a. In FIGS. 2b, 2c and 2d, the same steps are performed as described in the case of the blanket wafers: deposition of a thick silicon oxide layer 3 and CMP on said layer, thinning the $SiO_x$ layer by CMP (preferably to a roughness of less than 0.2 nm RMS), and deposition of a SiCN layer 4 on the thinned $SiO_x$ layer. A pre-bond annealing step is again performed at this point.

Figure 2A:
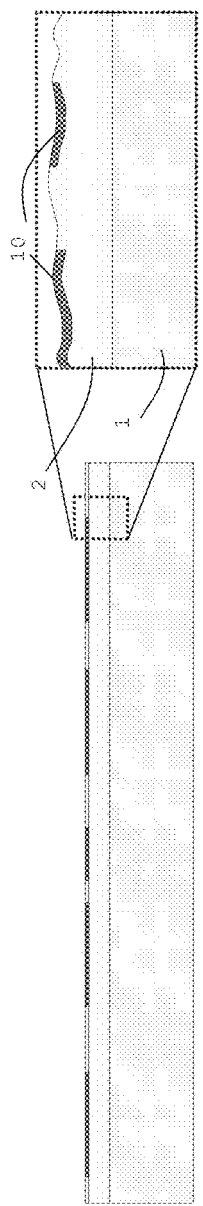
FIGS. 2a to 2h illustrate the process steps for direct bonding of hybrid wafers in a wafer-to-wafer bonding process according to the disclosed technology.
Figure 2B:
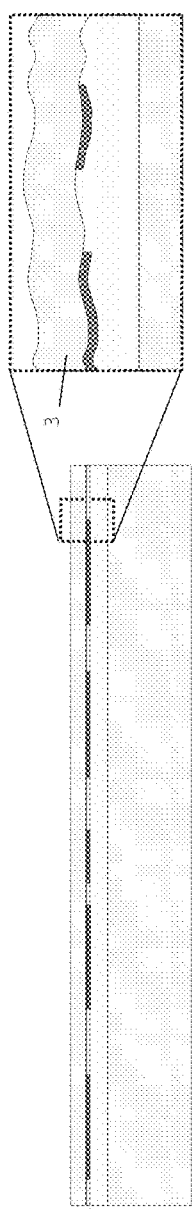
Figure 2C:
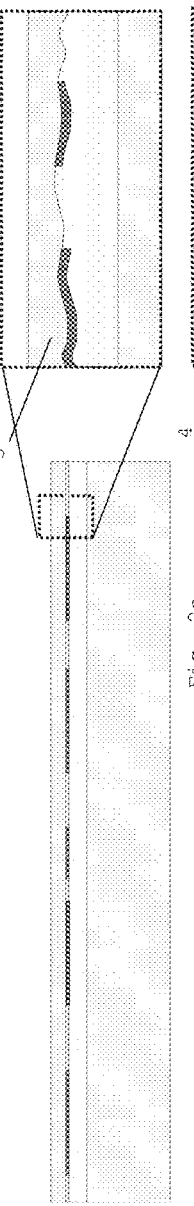
Figure 2D:
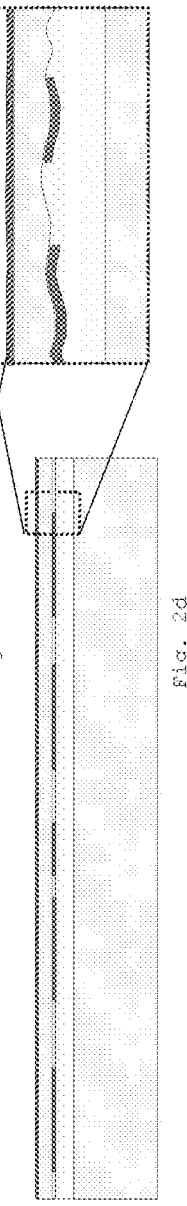
Figure 2E:
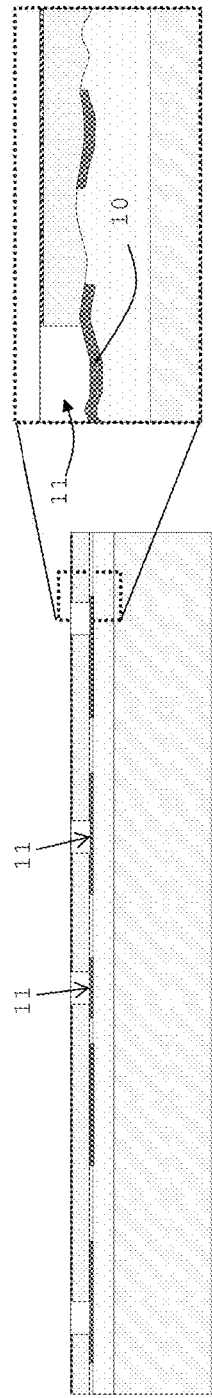
Figure 2F:
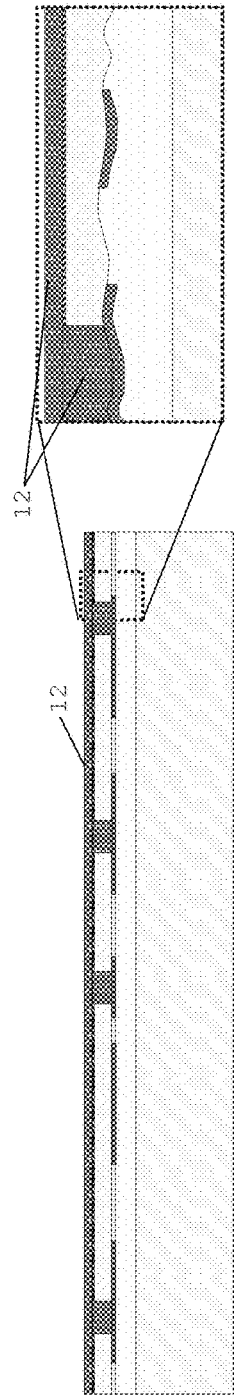
Figure 2G:
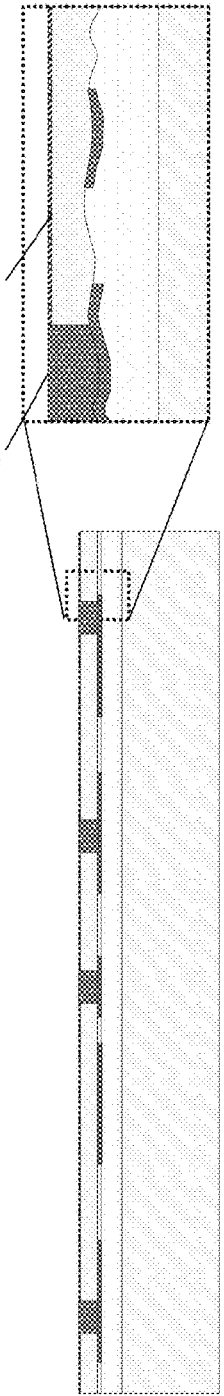

This is now followed by the production of openings 11 in the stack of $SiO_x$/SiCN layers (FIG. 2e), said openings being formed above a number of the metal islands 10 of the FEOL/BEOL layer 2. The formation of these openings can take place by standard lithography steps known in the art and not described in detail here. The openings are formed by removing the $SiO_x$ and SiCN throughout the complete thickness of the $SiO_x$/SiCN stack, thereby exposing the metal 10 at the bottom of the openings. Then a layer 12 of Cu is deposited in the openings and on top of the wafer. This may be done by any suitable technique known in the art. For example, a barrier layer and a Cu seed layer is deposited (not shown), followed by the electrodeposition of Cu 12 inside the openings and on top of the wafer (FIG. 2f). A CMP step is then performed which removes the Cu from the upper surface of the wafer. The SiCN layer 4 acts as a stopping layer for the CMP, as it exhibits a higher resistance to CMP than copper. At the same time, the CMP step reduces the roughness of the SiCN layer to the order of tenths of a nanometer, preferably less than 0.1 nm RMS. This results in the wafer as shown in FIG. 2g, where Cu regions 13 are surrounded by smooth SiCN areas 14. Once again, the steps illustrated in FIGS. 2a to 2g may be performed as part of a BEOL integration scheme. In that case, the pre-bond anneal temperature is preferably compatible with such an integration scheme, and may be between 400° C. and 450° C., preferably around 420° C.

Figure 2H:
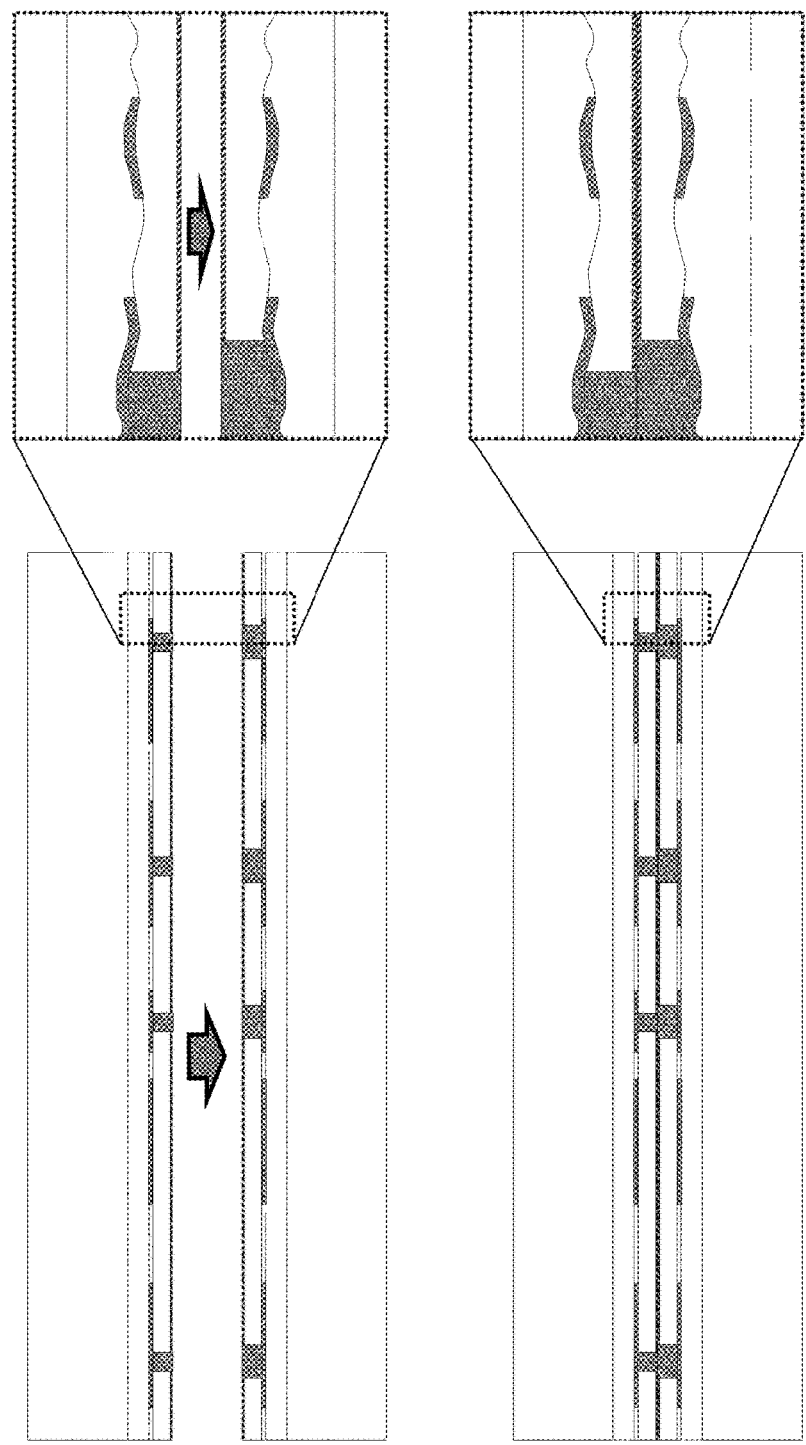

The bonding process is illustrated in FIG. 2h. Possibly after performing pre-treatments of the type described in relation to FIG. 1, corresponding metal areas are aligned and the bond is established by bringing the wafers in contact with each other under appropriate process conditions (see further). Bond formation between Cu areas preferably requires exerting a mechanical pressure that pushes the wafers together.

The bonding is followed by a post-bond anneal, at a temperature less than or equal to 250° C., preferably between 200° C. and 250° C., resulting again in excellent bond strength between bonded SiCN areas, despite the lower temperatures. The added advantage of using SiCN in this case is that the SiCN forms a barrier against Cu-diffusion.

The disclosed technology includes the method as described above, wherein one of the substrates is a semiconductor die instead of a wafer.

In any of the above-described embodiments, the process parameters during the bonding process, i.e. after pre-bond annealing and before post-bond annealing, may be chosen according to known bonding technology, in terms of temperature and ambient pressure in the bonding tool, as well as the pressure exerted mechanically to push the substrates against each other. Bonding may take place at room temperature or any other suitable temperature, preferably not higher than 500° C. According to a preferred embodiment, the temperature during bonding is the same or in the same range as the post-bond anneal, so that the post-bond anneal can take place in the same tool without losing time. A preferred range for the temperature during bonding is therefore the same range of 200-250° C. identified above for the post-bond anneal. The bonding preferably takes place at a low ambient pressure, preferably not lower than 10E-7 mBar, more preferably around 10E-6 mBar. The mechanical force used to push the substrates together may be up to 90 kN, with a preferred range between 40-60 kN. However in the case of the bonding between blanket wafers (as illustrated in FIG. 1, no metal areas on the surface), the bond may be established without a mechanical force being exerted.

EXAMPLES

In the following, a number of preferred process parameters are described for performing the method of the disclosed technology. The values given hereafter are given purely by way of example and are not limiting the scope of the disclosed technology.

Two wafers having FEOL/BEOL layers 2 are to be bonded by the method of the disclosed technology. They have a surface topology defined by a step height between 20 nm and 30 nm. The deposition of the $SiO_x$ layer 3 can take place by PECVD, at 340° C., under a pressure of 1 Torr, using as precursors silane and oxygen-containing gases such as NO, $NO_2$ or $O_2$.

A preferred value of the SiO, thickness is around 900 nm. The CMP on the $SiO_x$ layers includes a timed dielectric CMP step and a regular post CMP clean (megasonic cleaning), followed by treatment in 2 brush modules and a vapour dryer, e.g. in an integrated Desica cleaner.

The SiCN deposition takes place by PECVD, at 340° C. and 1 Torr. The precursor gases include a mixture of at least two types of gases:
  Si—C containing gases such as Tri-methyl silane and tetra-methyl-silane
  N containing gases such as $NH_3$, normally diluted in $N_2$
The pre-bond anneal takes place at 420° C. during 20 min, in a dissociated ammonia atmosphere containing 10% $H_2$.

The CMP on the SiCN layer includes a timed dielectric CMP step and a regular post CMP clean (megasonic cleaning), followed by treatment in 2 brush modules and a vapour dryer, e.g. in an integrated Desica cleaner, followed by a BTA (benzotriazole) rinse step. The post bonding annealing step is performed at 250° C. during 120 min in a dissociated ammonia atmosphere comprising 10% $H_2$.

Figure 3:
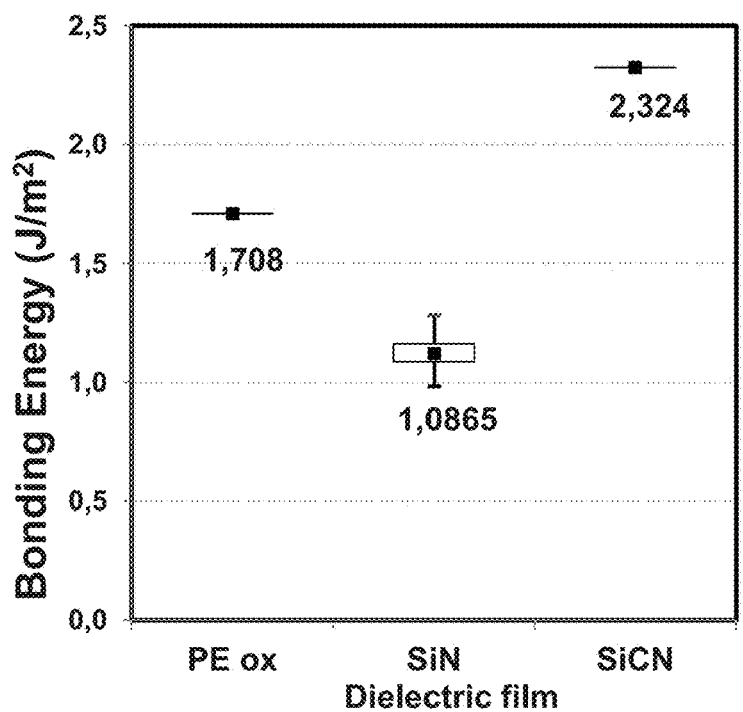
FIGS. 3 and 4 illustrate the high bond strength obtainable by the method of the disclosed technology on the basis of a number of comparative experimental results.

FIG. 3 illustrates the bond strength (expressed as the bonding energy in $J/cm^2$) obtained between SiCN layers produced with the above-described method, and compared to the bond strength obtained with other bonding layers, subjected to the same bonding process, including a post-bond annealing step at 250° C. during 2 hours. The layers to which the disclosed technology is compared were plasma enhanced silicon oxide (PE ox) and SiN. It is clear that the bond strength between SiCN layers obtained by the method of the disclosed technology is superior to the other materials.

Figure 4:
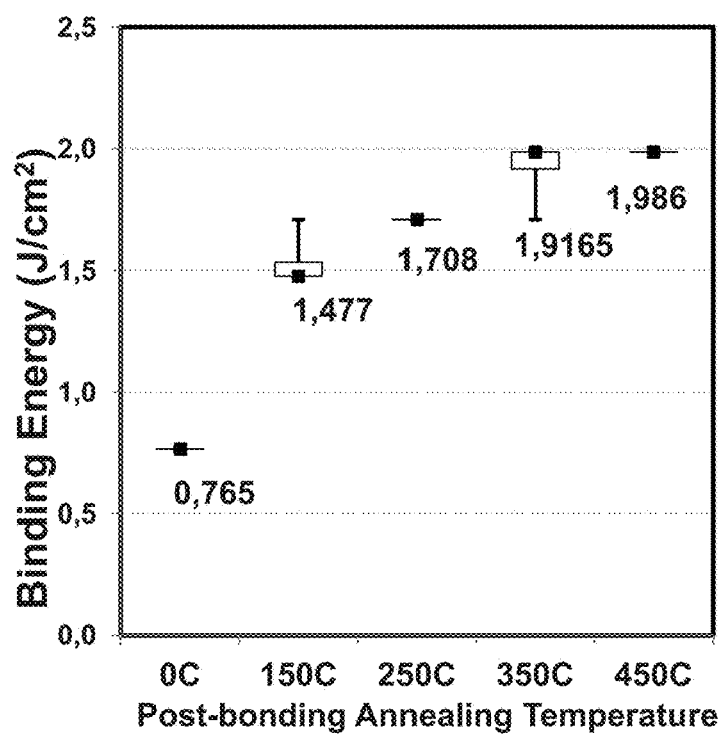

FIG. 4 shows bond strengths obtained between PE-ox layers as a function of the post-bond anneal temperature (each time annealing took place during 2 hours). Even at a temperature of 450° C., the bond strength is lower than the bond strength obtained between SiCN layers annealed at 250° C., according to the method of the disclosed technology.

An assembly of bonded substrates formed according to the above methods comprises first and second substrates each comprising a functional layer comprising semiconductor devices interconnected by back-end-of-the line metallization, a silicon oxide layer formed on the functional layer, and a SiCN formed on the silicon oxide layer. The silicon oxide layer is a planarized layer such that an interface formed between the silicon oxide layer and the SiCN layer is less than or equal to 0.2 nm root mean square (RMS). The SiCN layers of the first and second layer are bonded to each other to form a bonded interface having a bond strength greater than about 1.0, 1.6, 1.8, 2.0, 2.2 and 2.4 J/m$^2$ or a value within a range defined by any of these values. The SiCN layers are planarized layers such that the bonded interface has a roughness less than or equal to 0.1 nm root mean square (RMS). The presence of the bonded interface can be detected, e.g., using electron microscopy, X-ray photoelectron spectroscopy and secondary ion mass spectrometry, based on a mass contrast or deviation in stoichiometry. In embodiments, the bonded interface has a concentration of C and/or N that deviate at least 5%, 10%. 20%, 30%, or deviate by a percentage in a range defined by any of these values, from bulk regions of the SiCN layers.

In some embodiments, each of the first and second substrates is a hybrid dielectric/metal wafer comprising a patterned surface having areas comprising a dielectric material and areas comprising a metal. In these embodiments, the each of the first and second substrates has metal-filled vias formed though the respective SiCN layer and further through the respective silicon oxide layer, wherein corresponding ones of the metal-filled vias of the first and second substrates contact each other such that the functional layers of the first and second substrates are electrically connected to each other. Because the substrates are aligned within a tolerance, the corresponding ones of the metal-filled vias may be misaligned while still maintaining electrical contact.

While the disclosed technology has been illustrated and described in detail in the drawings and foregoing description, such illustration and description are to be considered illustrative or exemplary and not restrictive. Other variations to the disclosed embodiments can be understood and effected by those skilled in the art in practicing the claimed disclosed technology, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

Unless specifically specified, the description of a layer being present, deposited or produced 'on' another layer or substrate, includes the options of
  said layer being present, produced or deposited directly on, i.e. in physical contact with, said other layer or substrate, and
  said layer being present, produced or deposited on one or a stack of intermediate layers between said layer and said other layer or substrate.

While certain embodiments of the inventions have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A method of bonding semiconductor substrates, the method comprising:
  providing a first semiconductor substrate and a second semiconductor substrate to be bonded;
  pre-bond processing each of the first and second semiconductor substrates prior to bonding, pre-bond processing comprising:
    depositing a dielectric layer on a major surface of the each of first and second semiconductor substrates,
    chemical-mechanical polishing the dielectric layer of the each of the first and second semiconductor substrates to reduce the roughness of the dielectric layer,
    depositing a silicon carbon nitride (SiCN) layer on the dielectric layer of the each of the first and second semiconductor substrates,
    pre-bond annealing the each of the first and second semiconductor substrates, and
    chemical-mechanical polishing the SiCN layer to reduce the roughness of the SiCN layer;
  bonding the first and second semiconductor substrates, bonding comprising:
    aligning the first and second substrates, and
    contacting the SiCN layers of the first and second substrates, thereby forming an assembly of bonded substrates; and
  post-bond annealing the assembly of bonded substrates.

2. The method according to claim 1, wherein post-bond annealing is performed at a temperature less than or equal to 250° C.

3. The method according to claim 1, wherein chemical-mechanical polishing the SiCN layer includes reducing the roughness of the SiCN layer of the each of first and second semiconductor substrates to less than or equal to 0.1 mn root mean square (RMS).

4. The method according to claim 1, wherein chemical-mechanical polishing the dielectric layer includes reducing the roughness of the dielectric layer of the each of first and second semiconductor substrate to less than or equal to 0.2 nm root mean square (RMS).

5. The method according to claim 1, wherein the dielectric layer is a layer of silicon oxide.

6. The method according to claim 1, wherein the each of the first and second substrates is a blanket wafer, and wherein each of the dielectric layer and the SiCN layer is a continuous layer.

7. The method according to claim 1, wherein the each of the first and second substrates is a hybrid dielectric/metal wafer comprising a patterned surface having areas comprising a dielectric material and areas comprising a metal, and wherein the pre-bond annealing is followed by:

etching to form openings in a stack of layers including the dielectric layer and the SiCN layer, thereby exposing portions of the areas comprising the metal, and depositing a metal in the openings and on the SiCN layer, wherein chemical-mechanical polishing the SiCN layer comprises removing the metal on the SiCN layer, and stopping on the SiCN layer, thereby reducing the roughness of the SiCN layer.

8. The method of claim 1, wherein pre-bond annealing and post-bond annealing are performed at the same temperature.

9. The method according to claim 1, wherein pre-bond annealing is performed at a temperature between 400° C. and 450° C.

10. The method of claim 1, wherein one or both of pre-bond or post-bond annealing is performed in an ammonia atmosphere.

11. The method of claim 1, wherein each of the first and second semiconductor substrates comprises a functional layer comprising semiconductor devices interconnected by back-end-of-the line metallization and the dielectric layer formed on the functional layer.

12. The method of claim 1, wherein the dielectric layer is chemical-mechanically polished such that an interface formed between the SiCN layer and the dielectric layer has a roughness less than or equal to 0.2 nm root mean square (RMS).

13. The method of claim 1, wherein the (SiCN) layer on the first and second semiconductor substrates are bonded to each other to form a bonded interface having a bond strength greater than about 2.0 J/m$^2$.

14. The method according to claim 2, wherein the temperature is between 200° C. and 250° C.

15. An assembly of bonded substrates, comprising:
first and second substrates each comprising:
 a functional layer comprising semiconductor devices interconnected by back-end-of-the line metallization,
 a silicon oxide layer formed on the functional layer, and
 a SiCN layer formed on the silicon oxide layer, wherein the silicon oxide layer is planarized such that an interface formed between the SiCN layer and the silicon oxide layer has a roughness less than or equal to 0.2 nm root mean square (RMS),
wherein the SiCN layers of the first and second layer are bonded to each other to form a bonded interface having a bond strength greater than about 2.0 J/m$^2$.

16. The assembly of bonded substrates of claim 15, wherein the SiCN layers are planarized such that the bonded interface has a roughness less than or equal to 0.1 nm root mean square (RMS).

17. The assembly of bonded substrates of claim 15, wherein the bonded interface has a concentration of C or N that deviate at least 10% from bulk regions of the SiCN layers.

18. The assembly of claim 15, wherein the each of the first and second substrates is a hybrid dielectric/metal wafer comprising a patterned surface having areas comprising a dielectric material and areas comprising a metal, and wherein the each of the first and second substrates has metal-filled vias formed though the respective SiCN layer and further through the respective silicon oxide layer, wherein corresponding ones of the metal-filled vias of the first and second substrates contact each other such that the functional layers of the first and second substrates are electrically connected to each other.

* * * * *